(12) United States Patent
Kreda

(10) Patent No.: US 7,545,200 B2
(45) Date of Patent: Jun. 9, 2009

(54) LEAKAGE CURRENT COMPENSATED SYSTEM

(75) Inventor: Eugene J. Kreda, Natick, MA (US)

(73) Assignee: Xinetics, Inc., Devens, MA (US)

( * ) Notice: Subject to any disclaimer, the term of this patent is extended or adjusted under 35 U.S.C. 154(b) by 0 days.

(21) Appl. No.: 11/179,973

(22) Filed: Jul. 12, 2005

(65) Prior Publication Data

US 2007/0013437 A1    Jan. 18, 2007

(51) Int. Cl.
*G11C 5/14* (2006.01)

(52) U.S. Cl. ........................ 327/530; 327/538

(58) Field of Classification Search .............. 327/530, 327/538, 540–543; 323/312, 315–317
See application file for complete search history.

(56) References Cited

U.S. PATENT DOCUMENTS

| | | | | |
|---|---|---|---|---|
| 4,891,807 A * | 1/1990 | Hutch | ................. | 370/537 |
| 5,319,450 A * | 6/1994 | Tamayama et al. | ........ | 348/692 |
| 5,963,077 A * | 10/1999 | Kim | ................. | 327/408 |
| 5,982,220 A * | 11/1999 | Kim | ................. | 327/408 |
| 6,081,135 A * | 6/2000 | Goodnow et al. | ........ | 326/93 |
| 6,163,178 A * | 12/2000 | Stark et al. | ............. | 327/108 |
| 6,275,415 B1 * | 8/2001 | Haddad et al. | ........ | 365/185.11 |
| 6,366,159 B1 * | 4/2002 | Taheri | ................. | 327/538 |
| 6,492,798 B2 * | 12/2002 | Sunter | ............. | 324/76.15 |
| 7,013,183 B1 * | 3/2006 | Solomon | ............. | 700/11 |
| 7,034,603 B2 * | 4/2006 | Brady et al. | ........ | 327/538 |
| 7,208,993 B2 * | 4/2007 | Torres et al. | ........ | 327/403 |
| 2003/0151450 A1 * | 8/2003 | Nguyen et al. | ........ | 327/540 |
| 2003/0184359 A1 * | 10/2003 | Gammie et al. | ........ | 327/379 |
| 2003/0222307 A1 * | 12/2003 | Hoefler et al. | ........ | 257/347 |
| 2005/0110525 A1 * | 5/2005 | Chen | ................. | 326/115 |
| 2005/0219914 A1 * | 10/2005 | Sarin et al. | ........ | 365/189.01 |
| 2005/0248389 A1 * | 11/2005 | Nguyen | ........ | 327/538 |

* cited by examiner

*Primary Examiner*—Lincoln Donovan
*Assistant Examiner*—Thomas J Hiltunen
(74) *Attorney, Agent, or Firm*—Iandiorio Teska & Coleman

(57) ABSTRACT

A leakage current compensated multiplex driver system includes a multichannel mux having a predetermined leakage current at the switched side of each channel and a leakage current compensation circuit associated with the switched side of each channel for providing a compensation current matched to the predetermined leakage current.

4 Claims, 6 Drawing Sheets

LEAKAGE CURRENT COMPENSATED SYSTEM

FIELD OF THE INVENTION

This invention relates to a leakage current compensation circuit for a mux and more particularly to such a leakage current compensation circuit in a multiplex driver system such as for driving actuators of a deformable mirror.

BACKGROUND OF THE INVENTION

Analog driver controls used, for example, to operate the actuators of deformable mirrors use a drive amplifier with a feedback circuit to provide the required voltage to the actuators. There may be N addressable actuators. An input signal address—synchronized with a particular actuator is delivered by the drive amplifier through an N-channel power mux which applies that input signal to the addressed one of N actuators. A feedback mux simultaneously synchronizes the switching of the feedback circuit with the addressable actuator. A typical mux is one such as a Model No. 20207 available form Supertex of Sunnyvale, Calif.

Ideally each actuator will hold its charge as established by the input provided through the power mux at least until the next time it is again addressed with an input. However, some leakage occurs through the open channels of the power mux so that the proper charge/voltage is not maintained on the actuators and the shape of the deformable mirror is compromised.

BRIEF SUMMARY OF THE INVENTION

It is therefore an object of this invention to provide an improved leakage current compensation circuit for a mux.

It is a further object of this invention to provide such an improved leakage current compensation circuit for a mux in a multiplex driver.

It is a further object of this invention to provide such an improved leakage current compensation circuit for driving actuators of a deformable mirror.

It is a further object of this invention to provide such an improved leakage current compensation circuit which requires a lower refresh rate.

It is a further object of this invention to provide such an improved leakage current compensation circuit in which more channels can be addressed per drive amplifier because of the lower refresh rate.

It is a further object of this invention to provide such an improved leakage current compensation circuit which requires less power, cost, and space per channel because fewer drive amplifiers are required.

The invention results from the realization that an improved leakage current compensation circuit for a multiplex driver system which requires lower refresh rate, lower space, power and cost and can be achieved with a multichannel mux having a predetermined leakage current at the switched side of each channel and a leakage current compensation circuit associated with the switched side of each channel for providing a compensation current matched to the predetermined leakage current.

The subject invention, however, in other embodiments, need not achieve all these objectives and the claims hereof should not be limited to structures or methods capable of achieving these objectives.

This invention features a leakage current compensated multiplex driver system including a multichannel mux having a predetermined leakage current at the switched side of each channel and a leakage current compensation circuit associated with the switched side of each channel for providing a compensation current matched to the predetermined leakage current.

In a preferred embodiment the leakage current compensation circuit may include a current source; it may include a voltage source and a diode whose leakage current is matched to the predetermined leakage current. It may include a voltage source and any suitable semiconductor device whose leakage current is matched to the predetermined leakage current.

The invention also features a leakage current compensated multiplex drive system for a deformable mirror including a drive amplifier for providing address synchronize inputs for each actuator of a deformable mirror. There is a multichannel mux for selectively applying the inputs to the addressed actuators. The multichannel mux has a predetermined leakage current at the switched side of each channel. A leakage current compensation circuit associated with the switched side of each channel provides a compensation current matched to the predetermined leakage current for reducing charge loss from the actuators.

In a preferred embodiment the leakage current compensation circuit may include a current source; it may include a voltage source and a diode whose leakage current is matched to the predetermined leakage current. It may include a voltage source and any suitable semiconductor device whose leakage current is matched to the predetermined leakage current.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
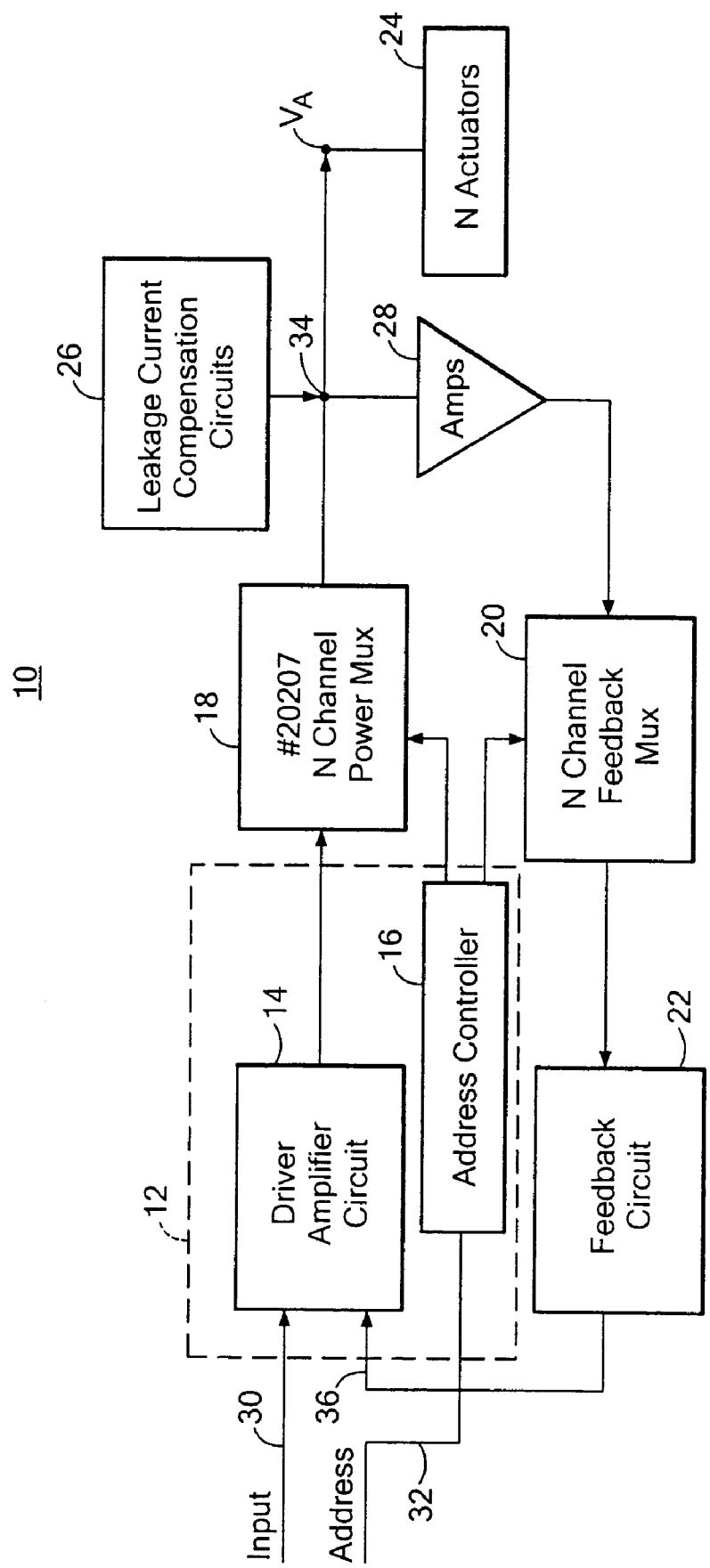
FIG. 1 is a schematic block diagram of a leakage current compensated multiplex driver system according to this invention.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a leakage current compensated multiplex driver system 10 including a drive amplifier 12 having a drive amplifier circuit 14 and address controller 16. System 10 also includes an N channel power mux 18, N channel feedback mux 20, feedback circuit 22, and N actuators 24. Associated with each actuator is a leakage current compensation circuit 26 and an amplifier 28.

In operation an input signal on line 30 to drive amplifier circuit 14 is accompanied by a synchronized address on line 32 to address controller 16 which identifies, to N channel power mux 18, the particular one of N actuators 24 to which the input 30 is to be delivered. The output voltage at 34 destined for a specific one of N actuators 24 is also fed back through amplifier 28 and N channel feedback mux 20 to feedback circuit 22 which provides the second input at 36 to drive amplifier circuit 14. When the inputs 36 and 30 are equal, output 34 to the selected one of N actuators 24 is confirmed as being at the input level provided at 30. Using a typical N channel power mux such as model 20207 available from Supertex of Sunnyvale, Calif., the leakage currents of the power mux have resulted in an average voltage change in actuator voltage $V_A$ of 0.328 volts over 500 seconds on the actuators 24, where the actuators have an equivalent 1 µf load capacitance. This is equivalent to a leakage current of 66 nanoamperes. Since the voltage monitoring circuit including amplifier 28, N channel feedback mux 20 and feedback circuit 22 has a leakage of only a few picoamperes most of the leakage is due to the high voltage mux 18 although the switch is well within the specifications of the manufacturer.

To solve this problem leakage current compensation circuits 26 are added. In the embodiment disclosed herein there is a leakage current compensation circuit associated with each of the N actuators, so there are N leakage current compensation circuits represented by leakage current compensation circuits 26. The components of leakage circuit compensation circuits 26 can be statistically matched to so that the amount of leakage current lost through power mux 18 is reduced to a manageable level. The more leakage current there is the more frequently actuators 24 will have to be refreshed. The more frequently they have to be refreshed, the shorter the cycle time is for the N channel power mux 18 and so additional power muxes 18 and drive amplifier circuits 14 will be required.

Figure 2:
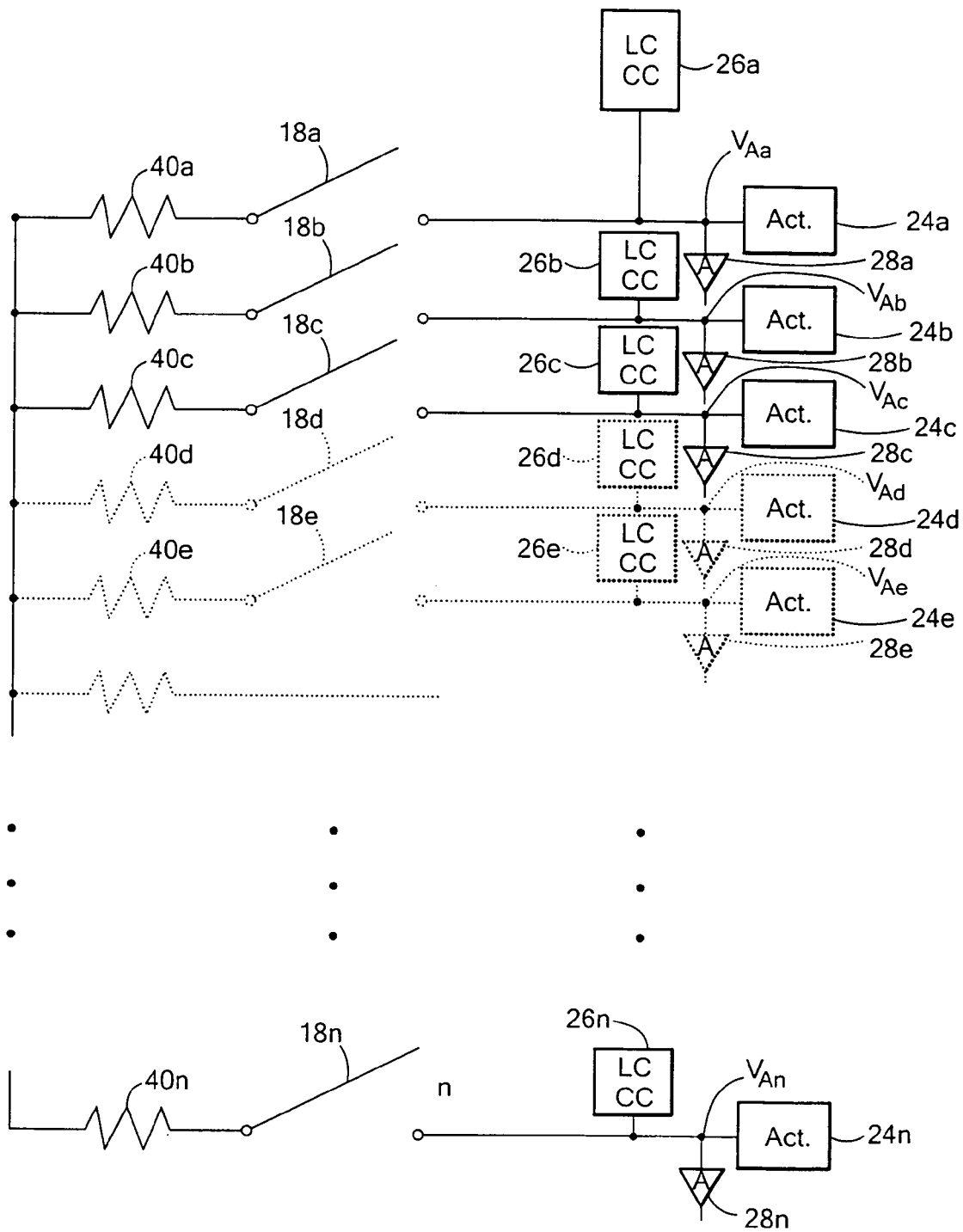
FIG. 2 is a more detailed schematic view of an N channel power mux and leakage current compensation circuit of FIG. 1.

N channel power mux 18 can be represented as shown in FIG. 2 by N switches 18a -18n, each of which is associated with an actuator 24a-24n, a leakage current compensation circuit 26a-26n, and an amplifier 28a-28n. Each input on line 30, FIG. 1, to driver amplifier circuit 14 is accompanied by an address on line 32 to address controller 16. Address controller 16 informs both power mux 18 and feedback mux 20 of the particular one of the actuators 24a-24n which is addressed. It then closes the proper one of switches 18a-18n and similarly actuates the proper switch in feedback mux 20. Feedback mux 20, as well as, amplifier 28 and feedback circuit 22 are all very low leakage devices and are not instrumental in the problem addressed here.

Figure 3:
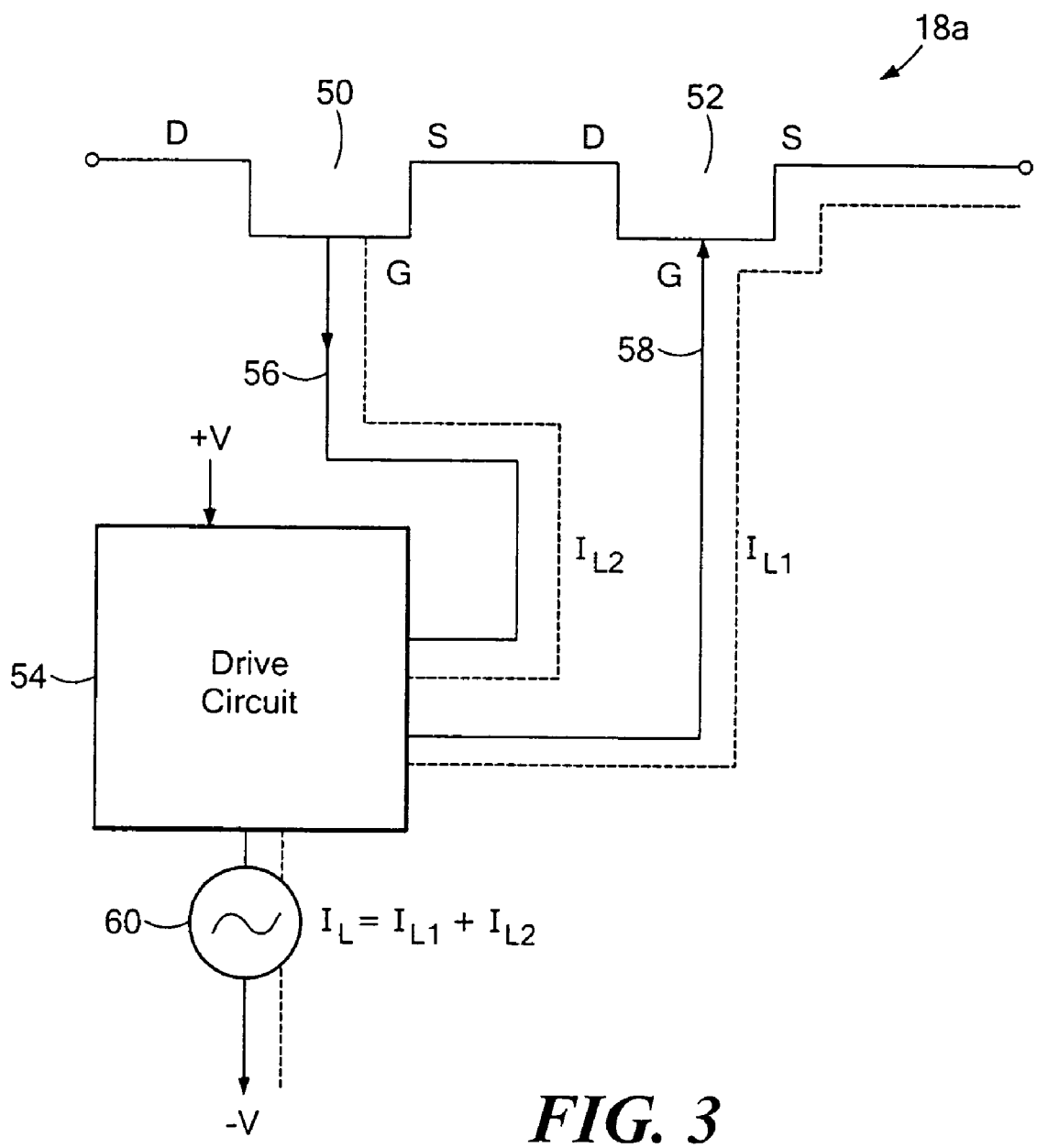
FIG. 3 is a more detailed schematic view of a portion of a conventional mux illustrating the leakage current.

Each switch 18a-18n, FIG. 2, has associated with it an internal resistance 40a-40n which represents the implementation as shown in FIG. 3. Switch 18a is shown as including two FET transistors 50, 52 connected in series source to drain with their gates connected to a drive circuit 54 which operates their respective gates 56, 58. In the off condition while mux 18 and mux 20 are addressing other ones of the actuators, FET switches 50 and 52 are open, but never the less, leakage currents $I_{L1}$ and $I_{L2}$ occur which are represented equivalently by leakage current source 60 which provides a leakage current $I_L$ equal to $I_{L1}+I_{L2}$. It is these leakage currents that cause a major leakage from the capacitance of the actuators 24 and cause their voltage to droop or drop significantly enough so that, for example, in implementing a deformable mirror the commanded deformation will not be met. By using leakage current compensation circuits 26, FIG. 1, 26a-26n, FIG. 2, a matching current $I_L$ can be provided to offset the leakage from the actuators 24a-24n to the power mux 18.

Figure 4:
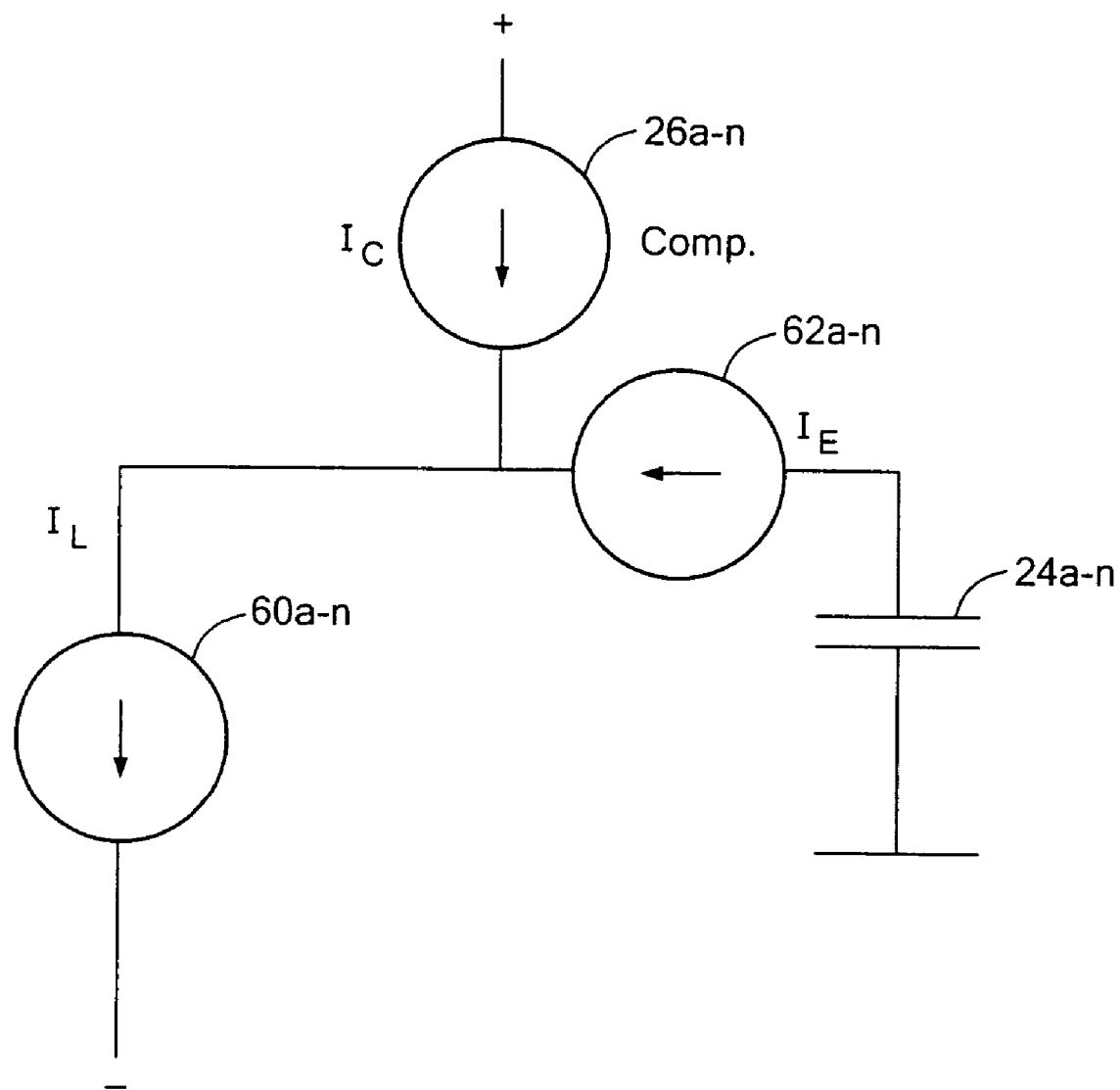
FIG. 4 is a schematic equivalent circuit showing the leakage current compensation.

An equivalent simplified representation of this appears in FIG. 4 where the leakage current $I_L$ assigned to current source 60a-n is offset by the compensation current $I_C$ provided by the leakage current compensation circuit 26a-n so that the difference or error current $I_E$ represented by current source 62a-n more closely approaches zero.

Figure 5A:
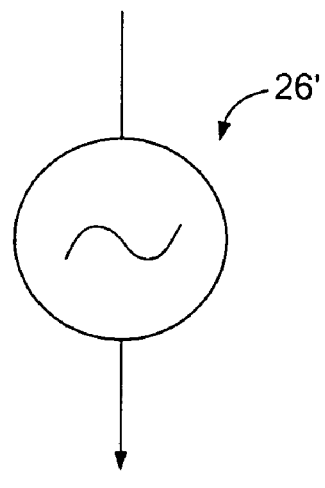
FIGS. 5 A-D are simplified schematic views of some examples of leakage current compensation circuits usable in this invention.
Figure 5B:
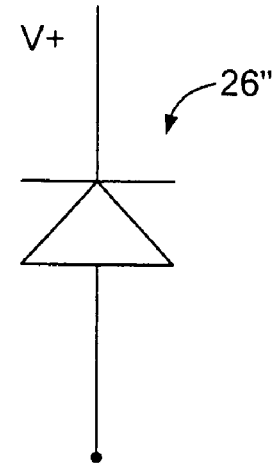
Figure 5C:
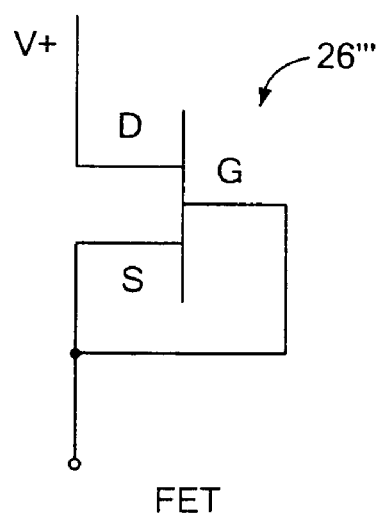
Figure 5D:
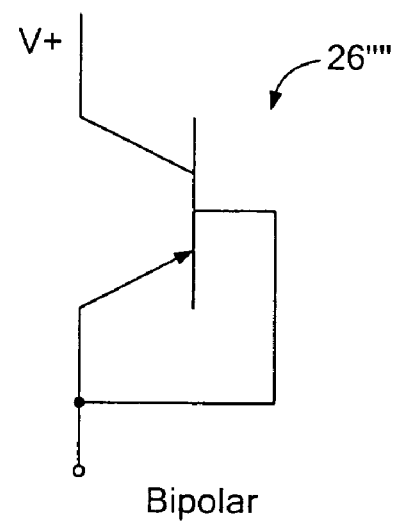

The particular implementation of leakage current compensation circuit 26a-26n may be a simple current source 26', FIG. 5A, or a back biased diode 26", FIG. 5B, which has a leakage current matched to that of leakage current of power mux 18, or an FET 26''' operating as a diode junction, FIG. 5C, or a bi-polar transistor 26'''' operating as a diode junction, FIG. 5D, or any other suitable semi-conductor device including the ceramic family of materials that can be arranged with a matched leakage.

Figure 6:
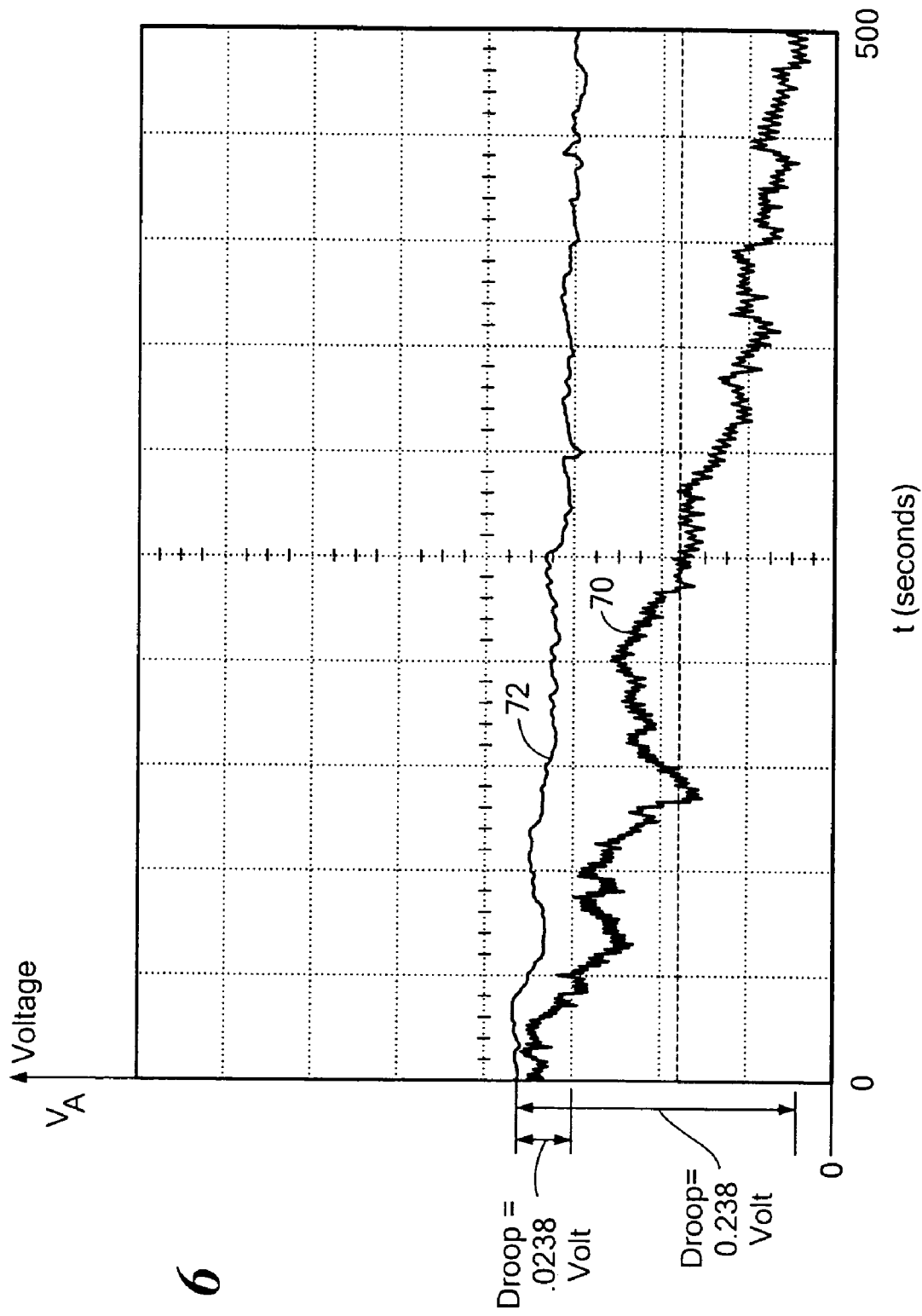
FIG. 6 is a graphical illustration of the more stable voltage level obtainable with this invention.

The result as shown in FIG. 6 where the abscissa is time in seconds and the ordinate is the actuator voltage, $V_A$ in volts, is a decrease by approximately a factor of 10 in the leakage voltage. There it can be seen that the conventional voltage droop 70, FIG. 6, is approximately 0.238 volts over the course of 500 seconds, whereas the voltage droop 72 employing this invention amounts to approximately 10 percent of that or 0.0238 volts.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A leakage current compensated multiplex driver system for a deformable mirror comprising:
   a driver amplifier for providing address synchronized inputs for each actuator of a deformable mirror;

a multichannel mux for selectively applying the inputs to the addressed actuators, said multichannel mux providing a predetermined leakage current at the switched side of each channel; and a leakage current compensation circuit associated with the switched side of each channel for providing a compensation current matched to the predetermined leakage current for reducing charge loss from the actuators.

2. The leakage current compensated multiplex driver system of claim 1 in which said leakage current compensation circuit includes a current source.

3. The leakage current compensated multiplex driver system of claim 1 in which said leakage current compensation circuit includes a voltage source and a diode whose leakage current is matched to said predetermined leakage current.

4. The leakage current compensated multiplex driver system of claim 1 in which said leakage current compensation circuit includes a voltage source and semiconductor device whose leakage current is matched to said predetermined leakage current.

* * * * *